US 6,732,904 B1

(12) United States Patent
Hsu

(10) Patent No.: US 6,732,904 B1
(45) Date of Patent: May 11, 2004

(54) SOLDER BALL HOLDING TERMINAL IN A BGA ARRANGEMENT

(76) Inventor: Feng-Chien Hsu, No. 6-1, Lane 114, Ming-Te St., Hsinchuang City, Taipei Hsien (TW)

( * ) Notice: Subject to any disclaimer, the term of this patent is extended or adjusted under 35 U.S.C. 154(b) by 0 days.

(21) Appl. No.: 10/277,195

(22) Filed: Oct. 21, 2002

(51) Int. Cl.⁷ ............................................... B23K 35/14
(52) U.S. Cl. ................ 228/56.3; 228/180.22; 228/246
(58) Field of Search .................. 228/56.3, 180.22, 228/245, 246; 257/737, 738; 438/613–617; 403/270–272

(56) References Cited

U.S. PATENT DOCUMENTS 5,887,344 A * 3/1999 Sinclair ........................ 29/843
5,932,891 A * 8/1999 Higashi et al. ................ 257/48
6,454,157 B2 * 9/2002 Olson ....................... 220/180.21
6,460,755 B1 * 10/2002 Inoue et al. ................. 228/246
2003/0016873 A1 * 1/2003 Nagel et al. ................. 382/228

* cited by examiner

Primary Examiner—M. Alexandra Elve
(74) Attorney, Agent, or Firm—Alan Kamrath

(57) ABSTRACT

A solder ball holding terminal has a first plate, a second plate and a third plate integrally formed with and sandwiched between the first plate and the second plate. The first plate has a first distal end, the second plate has a second distal end and the third plate has a third distal end and a fourth distal end. A distance between the third distal end and the fourth distal end is much smaller than that between the first distal end and the second distal end such that when a solder ball is inserted into a space defined among the first distal end, the second distal end, the third distal end and the fourth distal end, a substantially three-point support is provided to the solder ball so that the solder ball is securely clamped.

3 Claims, 3 Drawing Sheets

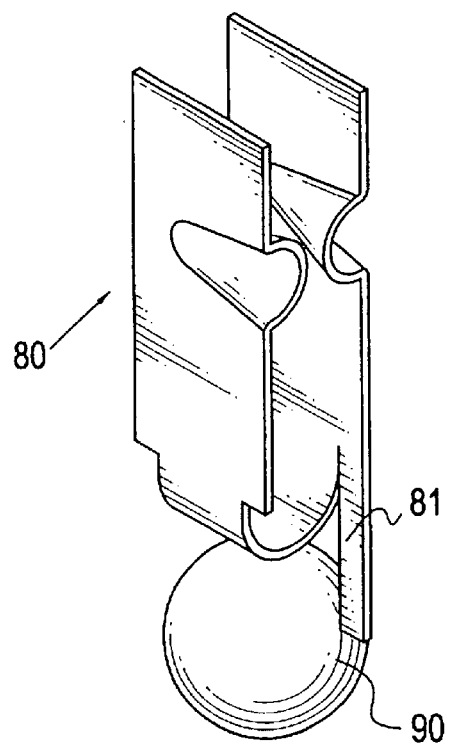
FIG. 5
PRIOR ART
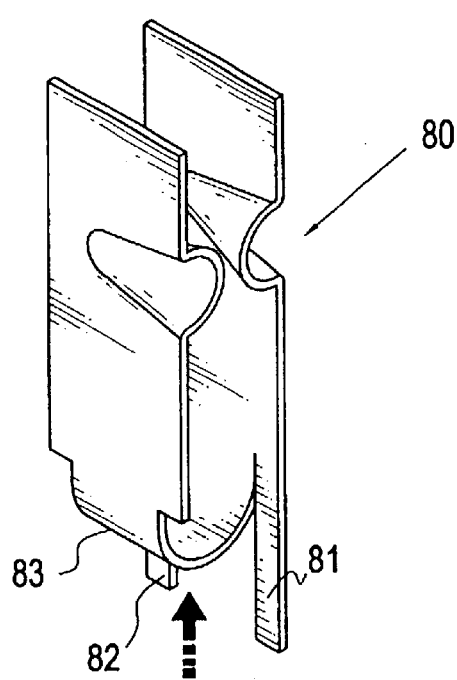
FIG. 4
PRIOR ART
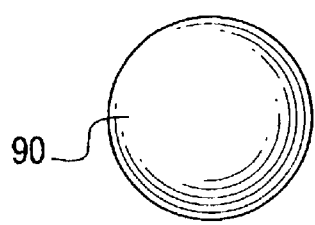

SOLDER BALL HOLDING TERMINAL IN A BGA ARRANGEMENT

BACKGROUND OF THE INVENTION

1. Field of the Invention

The present invention relates to a solder ball holding terminal, and more particularly to a solder ball holding terminal in a ball grid array (BGA) arrangement to securely hold the solder ball inside the holding terminal.

2. Description of Related Art

With reference to FIGS. 4 and 5, a conventional solder ball holding terminal (80) is integrally made and has a first leg (81), a second leg (82) and a stop (83) sandwiched between the first leg (81) and the second leg (82).

When a solder ball (90) is inserted into a space between the first leg (81) and the second leg (82), the first leg (81) and the second leg (82) are able to clamp an outer periphery of the solder ball (90) and the stop (83) limits further advancement of the solder ball (90) between the first leg (81) and the second leg (82).

It is well known in the art that when an object is clamped by two individual ends of the terminal, the object is not stably positioned. Therefore, the solder ball (90) very easily falls out from the terminal (80).

To overcome the shortcomings, the present invention tends to provide an improved solder ball holding terminal to mitigate and obviate the aforementioned problems.

SUMMARY OF THE INVENTION

The primary objective of the present invention is to provide an improved solder ball holding terminal having a first distal end, a second distal end, a third distal end and a fourth distal end, wherein a distance between the third and the fourth distal ends is much smaller than that between the first distal end and the second distal end. When a solder ball is inserted into a space defined among the first, the second, the third and the fourth distal ends, a three-point support is provided to the solder ball so that the solder ball is securely clamped by the solder ball holding terminal.

Another objective of the present invention is that the distance between the third distal end and the fourth distal end is able to allow the solder ball to deform so that the solder ball is firmly clamped inside the solder ball holding terminal.

Still another objective of the present invention is that a stop is respectively formed between the first distal end and the third distal end and the second distal end and the fourth distal end so that after the solder ball is inserted into a space among the first distal end, the second distal end, the third distal end and the fourth distal end, further advancement of the solder ball into the space is limited.

Other objects, advantages and novel features of the invention will become more apparent from the following detailed description when taken in conjunction with the accompanying drawings.

BRIEF DESCRIPTION OF THE DRAWINGS

FIG. 4 is a perspective view of a conventional solder ball holding terminal; and FIG. 5 is a schematic view showing that the conventional solder ball holding terminal is clamping the solder ball.

DETAILED DESCRIPTION OF THE PREFERRED EMBODIMENT

Figure 1:
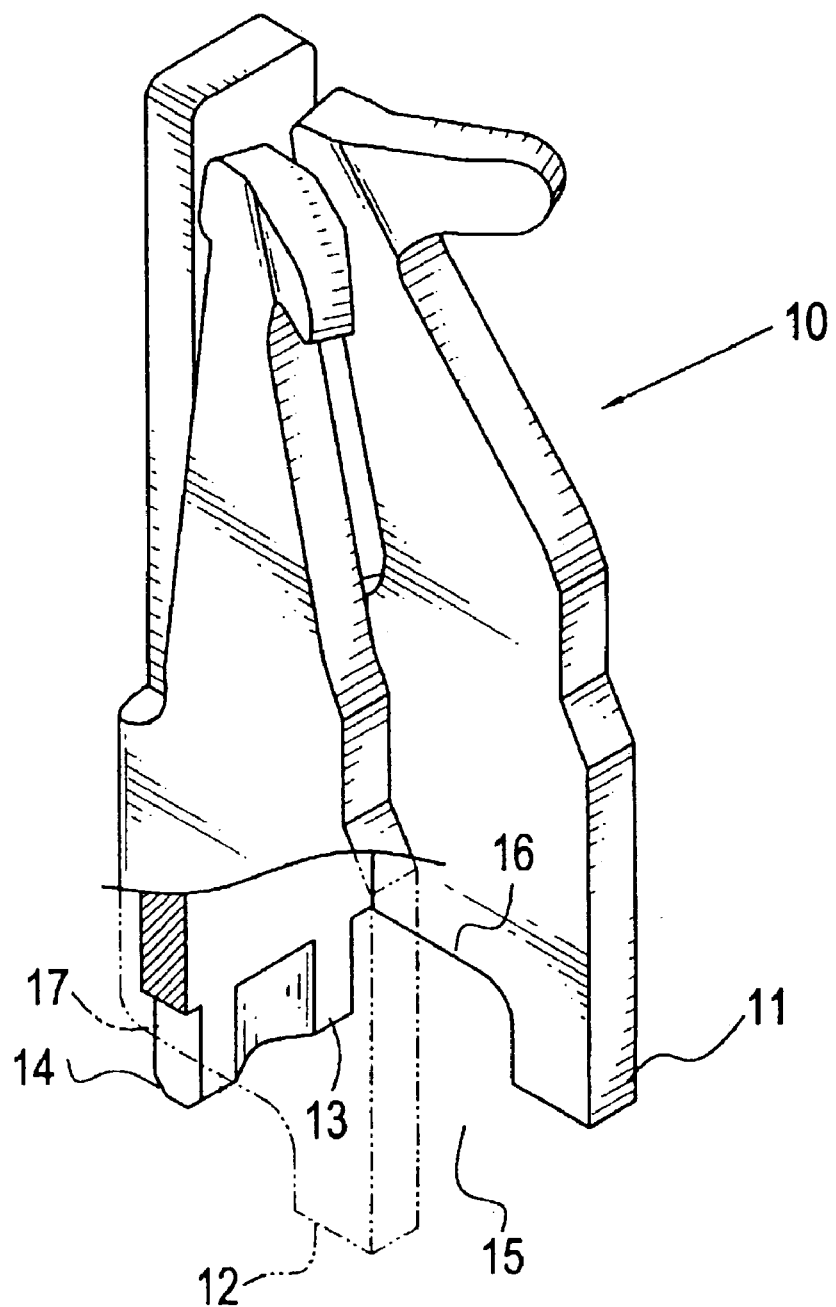
FIG. 1 is a perspective view of the solder ball holding terminal of the present invention.
Figure 3:
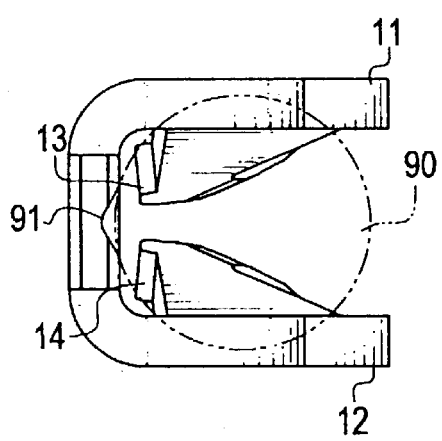
FIG. 3 is a top plan view of the solder ball holding terminal of the present invention.
Figure 2:
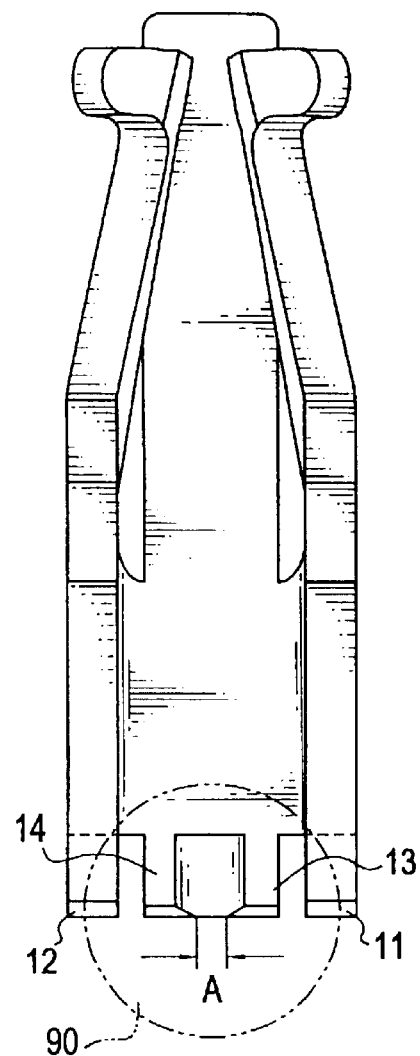
FIG. 2 is a front plan view of the solder ball holding terminal in FIG. 1.

With reference to FIGS. 1 and 2, the solder ball holding terminal (10) in accordance with the present invention has a first plate, a second plate and a third plate integrally formed with and sandwiched between the first plate and the second plate. The first plate has a first distal end (11). The second plate has a second distal end (12). The third plate has a third distal end (13) and a fourth distal end (14). A distance 'A' between the third distal end (13) and the fourth distal end (14) is much smaller than that between the first distal end (11) and the second distal end (12). When a solder ball (90) is inserted into a space (15) defined among the first distal end (11), the second distal end (12), the third distal end (13) and the fourth distal end (14), a substantially three-point support is provided to the solder ball (90) so that the solder ball (90) is securely clamped by the solder ball holding terminal (10).

Furthermore, the distance 'A' between the third distal end (13) and the fourth distal end (14) is able to allow the solder ball (90) to have a deformation (91) when the solder ball (90) is inserted into the space (15). Thus, the solder ball (90) is securely clamped by the solder ball holding terminal (10) of the present invention.

Still further, two stops (16,17) are respectively formed between the first distal end (11) and the third distal end (13) and the second distal end (12) and the fourth distal end (14) so that after the solder ball (90) is inserted into the space (15), further advancement of the solder ball (90) into the space (15) is limited.

From the foregoing description, it is noted that the solder ball holding terminal of the present invention not only provides a three-point support to securely clamp the solder ball (90), but also limits undesirable advancement of the solder ball (90) beyond the space (15).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A solder ball holding terminal in a ball grid array arrangement, the solder ball holding terminal having a first plate, a second plate and a third plate integrally formed with and sandwiched between the first plate and the second plate, wherein the improvements comprise:

the first plate has a first distal end, the second plate has a second distal end, the third plate has a third distal end and a fourth distal end, a distance between the third distal end and the fourth distal end is much smaller than that between the first distal end and the second distal end such that when a solder ball is inserted into a space defined among the first distal end, the second distal end, the third distal end and the fourth distal end, a substantially three-point support is provided to the solder ball so that the solder ball is securely clamped.

2. The solder ball holding terminal as claimed in claim 1, wherein the distance between the third distal end and the fourth distal end is so small that a deformation is formed on the solder ball after the solder ball is inserted into the space.

3. The solder ball holding terminal as claimed in claim 2, wherein two stops arc respectively formed between the first distal end and the third distal end and the second distal end and the fourth distal end so that after the solder ball is inserted into the space, further advancement of the solder ball into the space is limited.

\* \* \* \* \*